US006833563B2

(12) United States Patent
Rinaldi et al.

(10) Patent No.: US 6,833,563 B2
(45) Date of Patent: Dec. 21, 2004

(54) MULTI-STACK SURFACE MOUNT LIGHT EMITTING DIODES

(75) Inventors: Jarett L. Rinaldi, Beaverton, OR (US); Patrick D. Boyd, Aloha, OR (US); Al LaValle, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/965,234

(22) Filed: Sep. 25, 2001

(65) Prior Publication Data

US 2003/0057430 A1 Mar. 27, 2003

(51) Int. Cl.[7] .......................... H01L 29/26; H01L 29/22; H01L 29/267; H01L 23/02
(52) U.S. Cl. ............................ 257/81; 257/79; 257/80; 257/98; 257/99; 257/686
(58) Field of Search .................. 257/686, 79, 80, 257/98, 99, 81, 777, 100

(56) References Cited

U.S. PATENT DOCUMENTS

| 5,280,184 A | * | 1/1994 | Jokerst et al. ................. 257/82 |
| 5,324,962 A | * | 6/1994 | Komoto et al. ................ 257/88 |
| 5,396,086 A | * | 3/1995 | Engels et al. .................. 257/43 |
| 5,528,474 A | * | 6/1996 | Roney et al. .......... 264/272.13 |
| 6,093,940 A | * | 7/2000 | Ishinaga et al. ............. 257/100 |
| 6,392,294 B1 | | 5/2002 | Yamaguchi |
| 2002/0021725 A1 | * | 2/2002 | Abe ............................. 372/46 |
| 2002/0029071 A1 | * | 3/2002 | Whitehurst ................... 607/88 |
| 2002/0030444 A1 | * | 3/2002 | Muller-Mach et al. ....... 313/512 |
| 2002/0030445 A1 | * | 3/2002 | Fukasawa .................... 313/512 |
| 2002/0043923 A1 | * | 4/2002 | Natori ......................... 313/495 |

FOREIGN PATENT DOCUMENTS

| EP | 1103759 | | 5/2001 |
| EP | 1107321 | | 6/2001 |
| JP | 363030271 | * | 2/1988 |
| JP | 01-98273 | * | 4/1989 |
| JP | 402260670 | * | 10/1990 |
| JP | 02-296380 | * | 12/1990 |
| JP | 404137570 | * | 5/1992 |
| JP | 05-131499 | * | 5/1993 |
| JP | 05-152606 | * | 6/1993 |
| JP | 05-315653 | * | 11/1993 |
| JP | 06085327 | | 3/1994 |
| JP | 408264841 | * | 10/1996 |
| JP | 09321345 | | 12/1997 |
| JP | 11161416 | | 6/1999 |
| JP | 2000188358 | | 7/2000 |
| RU | 1347831 | * | 7/1996 |
| WO | WO 9941785 | | 8/1999 |

* cited by examiner

*Primary Examiner*—Kamand Cuneo
*Assistant Examiner*—James M. Mitchell
(74) *Attorney, Agent, or Firm*—Paul E. Steiner

(57) ABSTRACT

A surface mount device light emitting diode package is provided. The package includes a circuit board housing attached to a printed circuit board. The circuit board housing supports a first light emitting diode and a second light emitting diode. The light emitting diodes are then coupled to the printed circuit board.

6 Claims, 6 Drawing Sheets

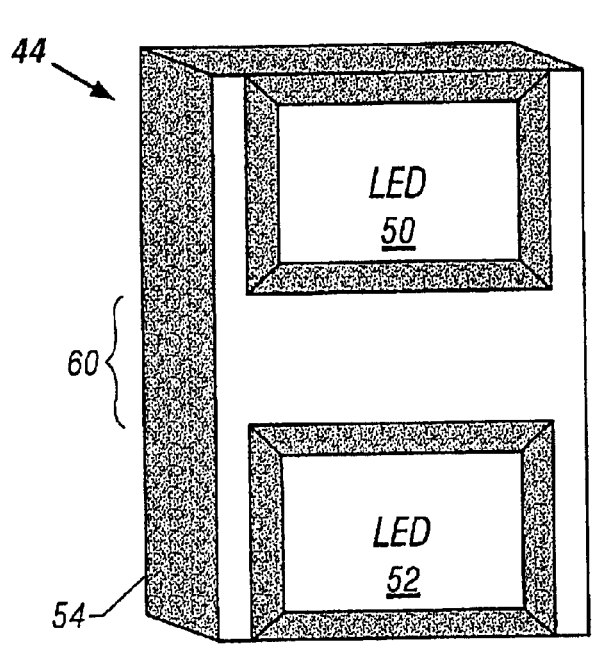
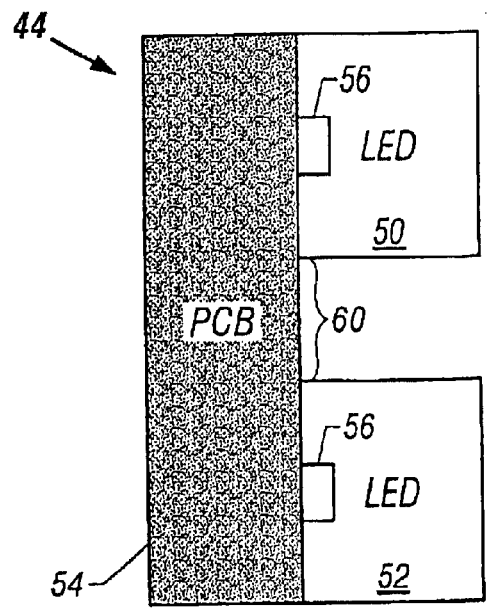
*FIG. 5A*  *FIG. 5B*
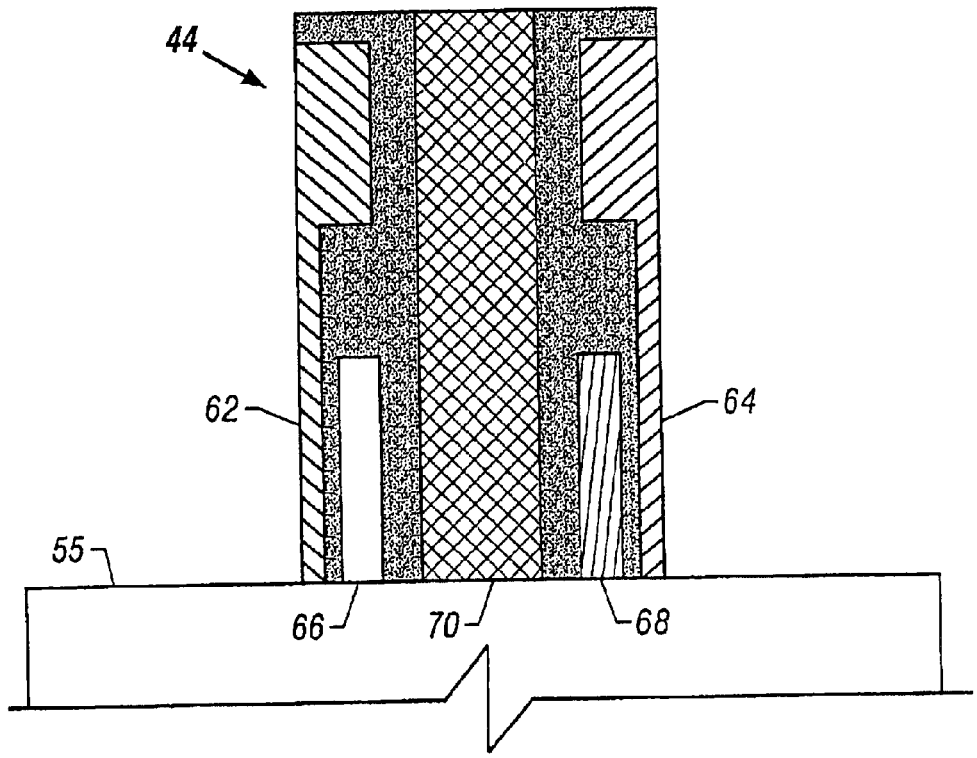
*FIG. 6*

MULTI-STACK SURFACE MOUNT LIGHT EMITTING DIODES

BACKGROUND OF THE INVENTION

1. Field of the Invention

The present invention relates generally to increasing the utilization of light emitting diodes (LEDs) mounted on printed circuit boards. More particularly, the present invention relates to allowing multi-stack surface mounted LEDs and decreasing the board space required by the LEDs.

2. Description of the Related Art

In a conventional computer system, printed circuit boards (PCBs) are used to mount semiconductor chips and other electronic components. Computers typically use several types of PCBs including motherboards and various expansion boards. The motherboard usually contains the central processing unit (CPU), memory, and controllers for the computer. Examples of expansion boards include graphics, video, and disk drive cards, as well as local area network (LAN) cards.

An LED is an electronic device that radiates light when electricity is passed through it. LEDs are extremely versatile and thus, widely used in various electronic fields. For example, LEDs are good for displaying images because they can be relatively small, and they do not burn out. With regard to computers, LEDs are mounted on PCBs to function as indicators. For example, an LED mounted on an expansion board may radiate light in different colors to indicate the status of the board. A green light typically indicates a good status, while a red light typically implies that something is wrong.

FIG. 1A is a frontal view and FIG. 1B is a side view of a typical multi-stacked through hole mount (THM) LED module 10 mounted on a PCB 12. LED package 10 includes three LEDs 14, 16, and 18 coupled to a THM housing 20. THM housing 20 is usually mounted about a half a millimeter off PCB 12. Each LED 14, 16, and 18 includes a cathode and anode wire extending outside THM housing 20 for connecting it with PCB 12. Because the wires are bent to allow LEDs 14, 16, and 18 to emit light along the same plane as PCB 12, the LEDs are known as right angle LEDs.

While LED package 10 has generally been an adequate apparatus to house LEDs in computer systems, it has many limitations. As can be seen from FIGS. 1A and 1B, the structure of LED package 10 is not very sturdy. Because PCBs are still often manipulated by hand and because LED package 10 juts out from the surface of PCB 12 when mounted, it is fragile and quite easy to break by accident. THM-LED packages are also frequently broken by test equipment. Furthermore, as computer technology continues to improve, PCBs become more and more densely populated with chips and other components, adding to the difficulty. One form of sturdier LED package that has been developed is known as a surface mount device (SMD) LED package.

FIG. 2A is a top view and FIG. 2B is a back view of a typical SMD-LED package 22. Unlike THM-LED package 10, SMD-LED package 22 is mounted directly onto PCB 24, rising only slightly above the surface of the board. SMD-LED package 22 also includes a LED die 26 encased in a SMD housing 28, which includes a layer of epoxy 30 so that LED die 26 is able to emit light through it. In addition, the bottom of SMD housing 28 is also a form of circuit board material and includes a cathode surface 32, a reinforcing non-electrode pin 34, and an anode surface 36, all of which are soldered to PCB 24. The actual solder material is not illustrated for purposes of clarity in FIG. 2B.

As is shown from FIGS. 2A and 2B, SMD-LED packages have many advantages over traditional THM-LED packages. A SMD-LED package is much sturdier and smaller by comparison. Therefore, in addition to minimizing breakage, SMD-LED packages use much less space, allowing for more efficient utilization of the PCB. Furthermore, SMD-LED packages are much easier to manufacture. Automated machines are able to "pick and place" surface mounted devices at phenomenal rates.

However, a major problem with SMD-LED packages is that they are not able to house and utilize multiple LEDs, unlike the THM-LED packages shown in FIGS. 1A and 1B. To display multiple signals, multiple SMD-LED packages must be used instead of a single multi-stacked THM-LED package, requiring far too much valuable space on a PCB. In addition, the inability to use multiple LEDs is a major disadvantage because there are many applications where PCBs need to send multiple signals to transmit information to either a technician or an end user.

In view of the foregoing, it is desirable to have a method and apparatus that provides for a multi-stacked SMD-LED package to reduce the risk of breakage. It is also desirable to have a multi-stacked SMD-LED package to display multiple status signals so that space can be more efficiently used on a PCB.

BRIEF DESCRIPTION OF THE DRAWINGS

The present invention will be readily understood by the following detailed description in conjunction with the accompanying drawings. To facilitate this description, like reference numerals designate like structural elements.

FIG. 5A is a front view and FIG. 5B is a side view of 2-high SMD-LED package in accordance with one embodiment of the present invention.

FIG. 6 is a back view of 2-high SMD-LED package in accordance with one embodiment of the present invention.

DETAILED DESCRIPTION

A method and apparatus for a multi-stacked SMD-LED package is provided. The multi-stacked SMD-LED package uses space more efficiently than a multi-stacked THM-LED package and also avoids and resists breaking. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 2A:
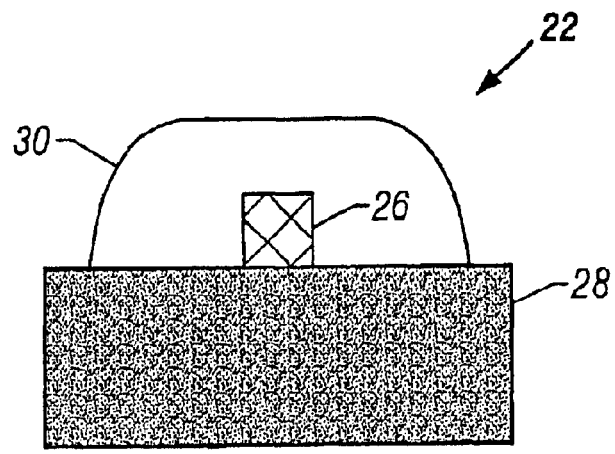
FIG. 2A is a top view and FIG. 2B is a back view of a typical SMD-LED package mounted on a PCB.
Figure 2B:
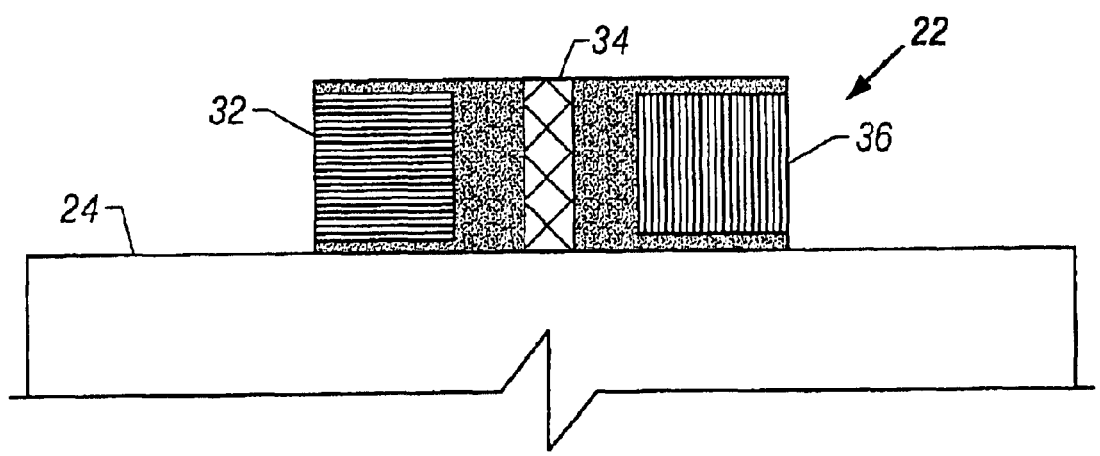
Figure 3:
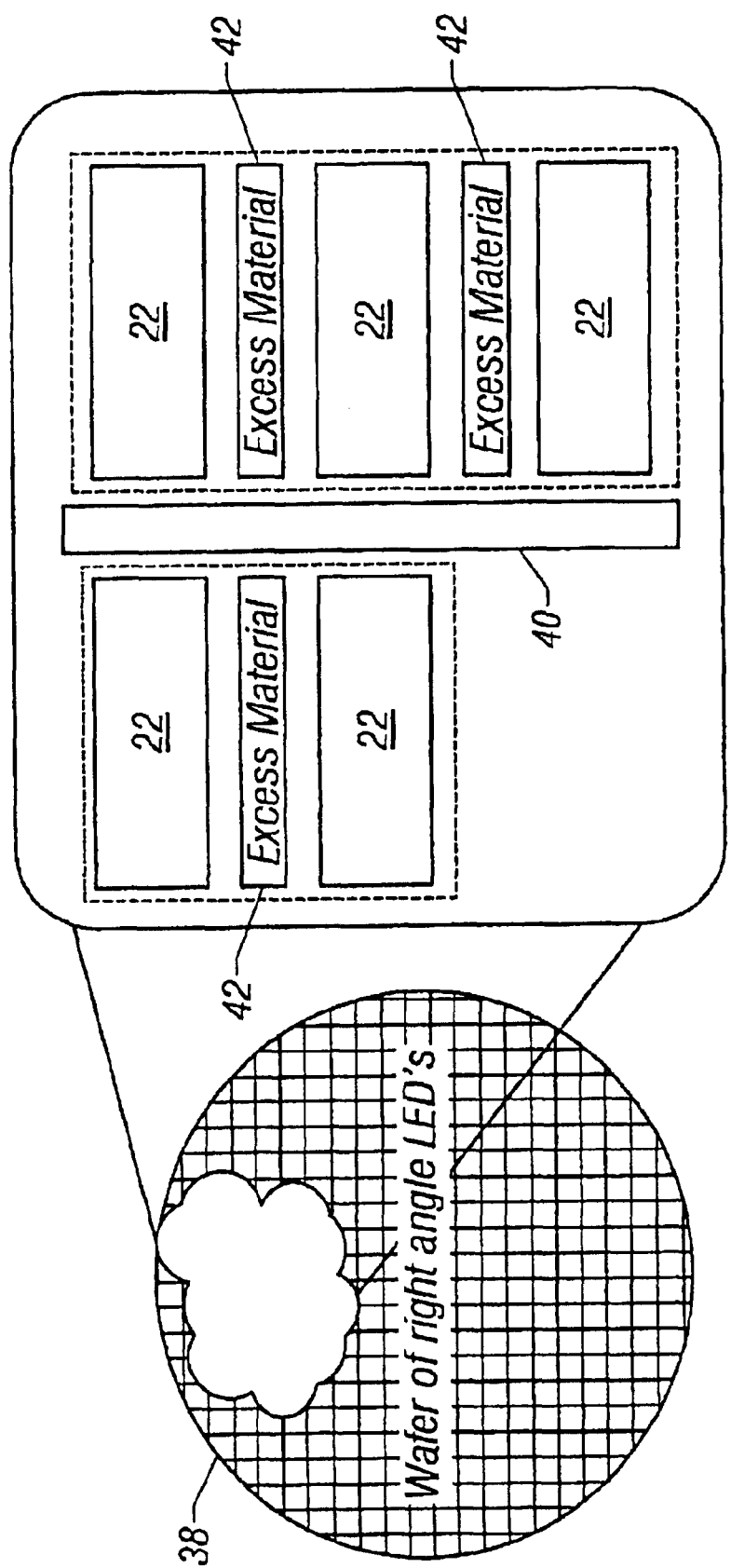
FIG. 3 illustrates a round LED wafer used to fabricate standard SMD-LED packages shown in FIGS. 2A and 2B.

FIG. 3 illustrates a round LED wafer 38 used to fabricate standard SMD-LED packages shown in FIGS. 2A and 2B. LED wafer 38 is manufactured to include a large number of SMD-LED packages 22. To release the individual SMD-LED packages 22 from LED wafer 38 efficiently, a number of LED wafers 38 are stacked on top of one another. The round shape of LED wafer 38 allows the wafer to be more easily grasped and manipulated. LED wafer 38 is then diced along excess wafer material, such as vertical wafer lines 40 and horizontal wafer lines 42. This results in a large number of individual SMD-LED packages 22 that may later be mounted on a PCB.

While LED wafer 38 is used for fabricating standard SMD-LED packages, it may also be used to fabricate a multi-stacked SMD-LED package in accordance with the present invention. LED wafer 38 has two features that are used to manufacture the present invention. Firstly, because the housing of the SMD-LED package comprises layered circuit board material, it may be etched with different features and connections as with any typical wafer. Secondly, horizontal wafer lines 40 and vertical wafer lines 42, which separate the packages, surround each SMD-LED package.

Figure 4:
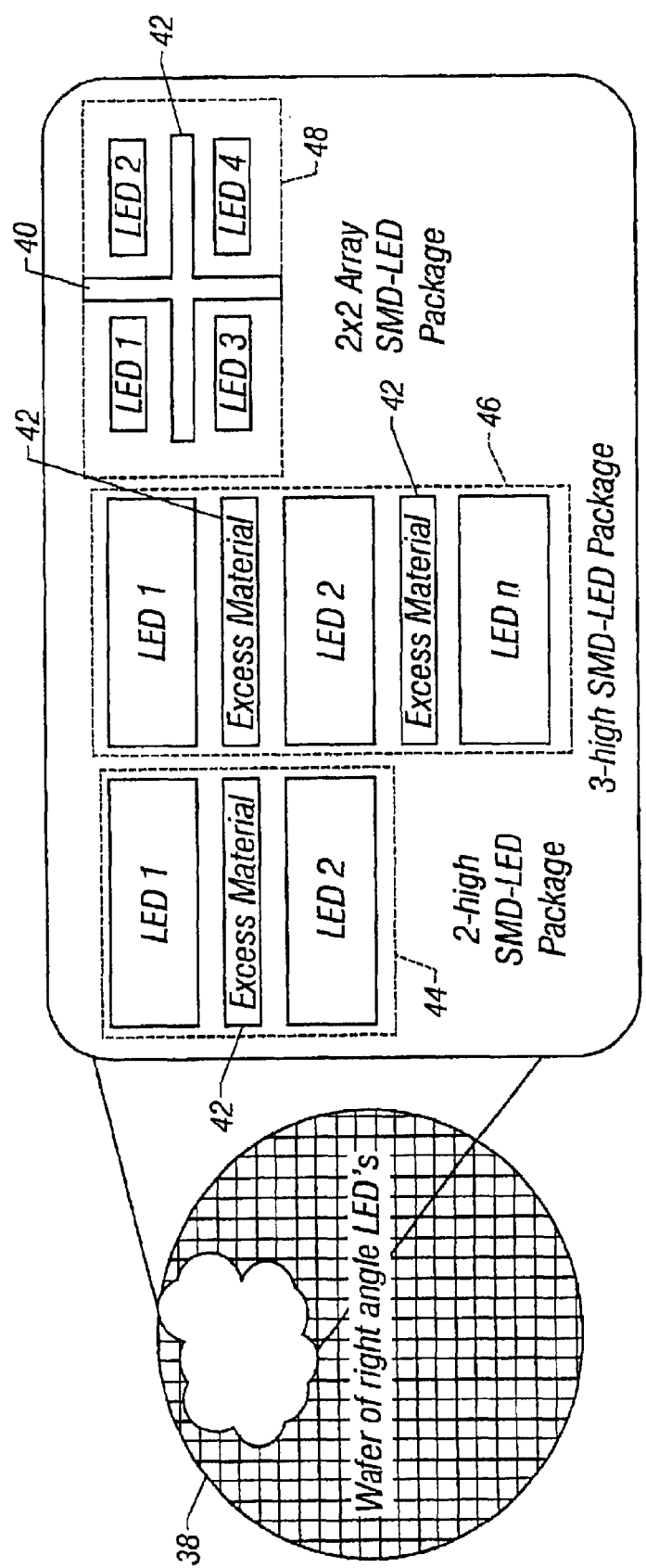
FIG. 4 illustrates a round LED wafer used to fabricate multi-stacked SMD-LED packages in accordance with several embodiment of the present invention.

FIG. 4 illustrates a round LED wafer 38 used to fabricate multi-stacked SMD-LED packages 44, 46, and 48 in accordance with several embodiment of the present invention. Each of multi-stacked SMD-LED packages 44, 46, and 48 represent different embodiments of the present invention that may be formed from LED wafer 38 depending on how the wafer is diced and what embodiment is desired.

For example, in multi-stacked SMD-LED package 44, one horizontal wafer line 40 is left between LED 1 and LED 2 to form a 2-high SMD-LED package. In multi-stacked SMD-LED package 46, two horizontal wafer lines 40 are left between LED 1, LED 2, and LED 3 to form a 3-high SMD-LED package. Finally, in multi-stacked SMD-LED package 48, one horizontal wafer line 40 and one vertical wafer line 42 are left between the four LEDs to form a 2×2 array SMD-LED package.

The above examples show that multi-stacked SMD-LED packages of all sizes and shapes may be diced from LED wafers depending on what type of package is needed. The ability to manufacture the present invention with a standard LED wafer is a great advantage to have for a new product because the wafers are already used to mass-produce single level SMD-LED packages in large volumes. Changing the way wafers are cut and the pattern and features that are etched into the circuit board would not be a costly modification.

FIG. 5A is a front view and FIG. 5B is a side view of 2-high SMD-LED package 44 in accordance with one embodiment of the present invention. 2-high SMD-LED package includes two LEDs 50 and 52 mounted on a circuit board housing 54, which electrically connects 2-high SMD-LED package 44 with PCB 55. Each LED 50 and 52 includes a LED die 56 encased by an epoxy layer 58. The circuit board material of circuit board housing 54 between LEDs 50 and 52, is a result of excess wafer material between the LEDs as indicated by reference number 60. This material is left over from the original round LED wafer as described with regard to horizontal wafer lines 40 and vertical wafer lines 42 in FIG. 4.

FIG. 6 is a back view of 2-high SMD-LED package 44 in accordance with one embodiment of the present invention. The bottom of circuit board housing 54 of SMD-LED package 44 includes a cathode 62 and an anode 64 for LED 50. Fitting neatly into circuit board housing 54 below cathode 62 and anode 64 are a cathode 66 and an anode 68 for LED 52. Cathodes 62 and 66 and anodes 64 and 68 are separated by a non-electrode reinforcing pin 70. When 2-high SMD-LED package 44 is soldered to a PCB, cathodes 62 and 66 and anodes 64 and 68 provide electricity to LED dies 56. The connection therefore allows LEDs 50 and 52 to emit light through epoxy layers 58.

As is clear from FIG. 6, the bottom LED wafer 38 can be patterned into the appropriate circuit traces to connect all of the different embodiments of multi-stacked SMD-LED package (examples of which are shown in FIG. 4) to a PCB of a computer system. As stated above, the capacity to use a standard LED wafer to manufacture the present invention allows for easy production of a surface mounted device that is able to house multiple LEDs. The ability to emit multiple signals is required in about 60% of all LED packages in a computer system.

Multi-stacked SMD-LED packages in accordance with the present invention have many advantages over the prior art. One advantage is that the present invention dramatically decreases the amount of precious PCB space required in the prior art. Multi-stacked SMD-LED packages are much smaller than standard multi-stacked through hole mount LED packages allowing the PCB to have more free space to support other computer chips and components, resulting in better overall system performance.

Figure 1A:
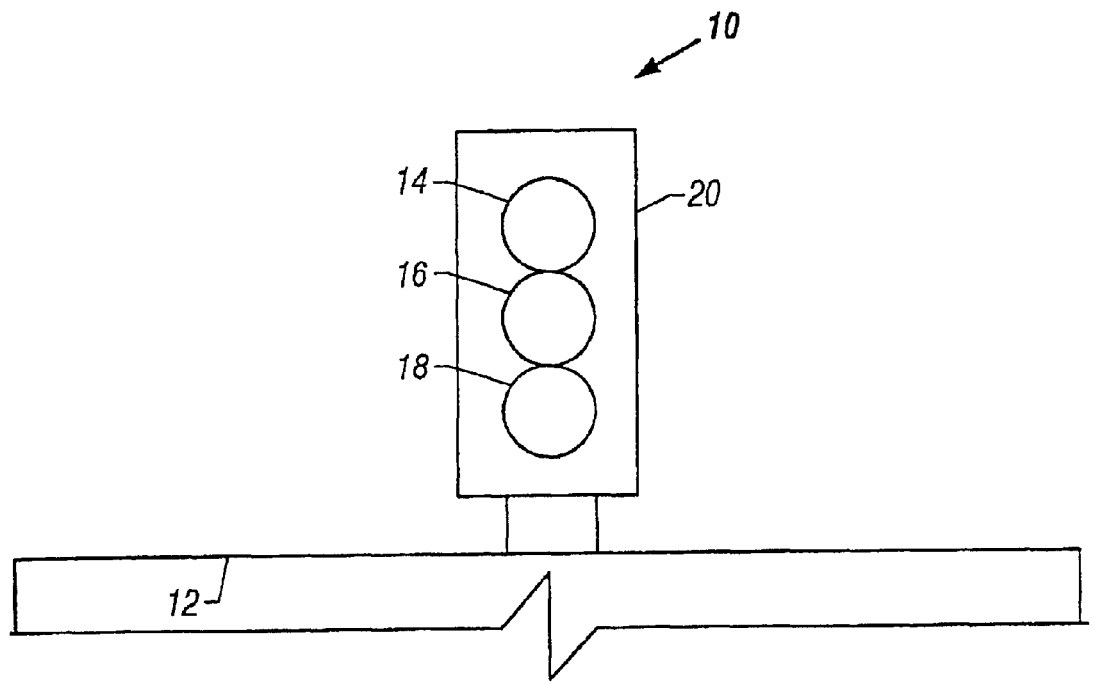
FIG. 1A is a frontal view and FIG. 1B is a side view of a typical multi-stacked THM-LED module mounted on a PCB.
Figure 1B:
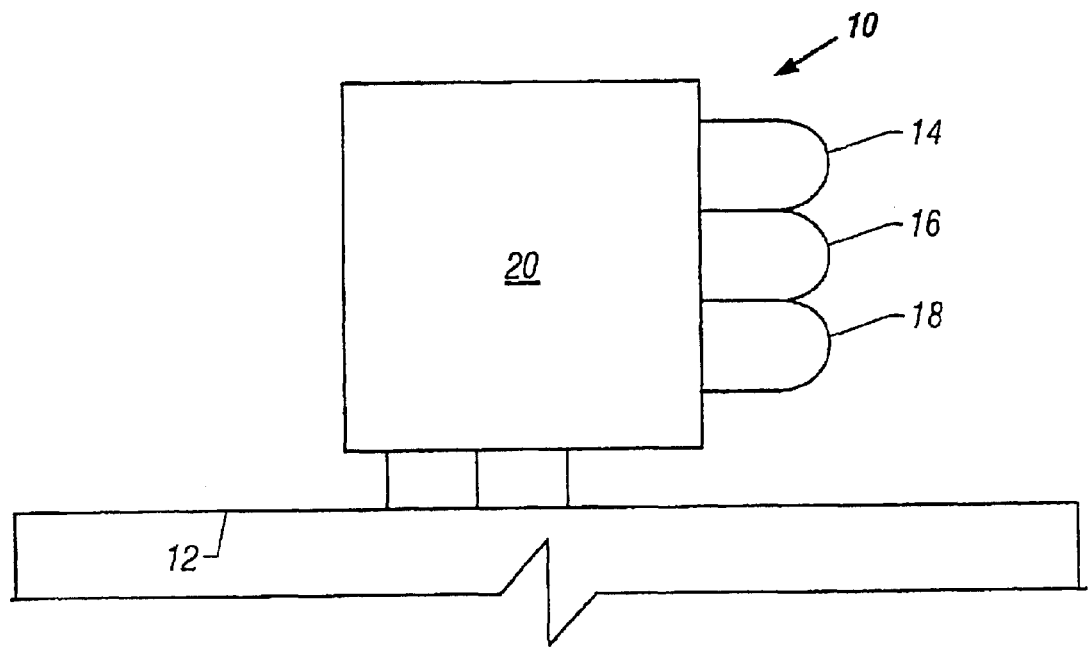

The much smaller size of multi-stacked SMD-LED packages not only reduces the cost of manufacturing (less material is required), but also greatly reduces the chance of accidental breakage. As is clear from FIGS. 1A and 1B, prior art multi-stacked THM-LED packages are very prone to snapping because they extend much further from the PCB when installed. Therefore, multi-stacked THM-LED packages are much more vulnerable than multi-stacked SMD-LED packages because PCBs are often being manipulated by hand or in contact with other computer components. In addition, multi-stacked SMD-LED packages have a much more sturdy construction than any THM-LED packages and able to tolerate much more contact.

Another advantage of the present invention is that multi-stacked SMD-LED packages are much easier to manufacture than any multi-stacked THM-LED package because there is because there is no hand assembly involved. Surface mounted devices are installed onto the PCB by automated equipment. The automated process is much quicker and more convenient than the assembly process for THM-LED packages leading to a decreasing throughput time and increasing beat rate. Multi-stacked SMD-LED packages are manufactured without lead in any of its components, meeting the lead free initiatives of many high tech companies. Prior art THM-LED packages require lead in its cathode and anode leads to aid soldering.

Figure 7:
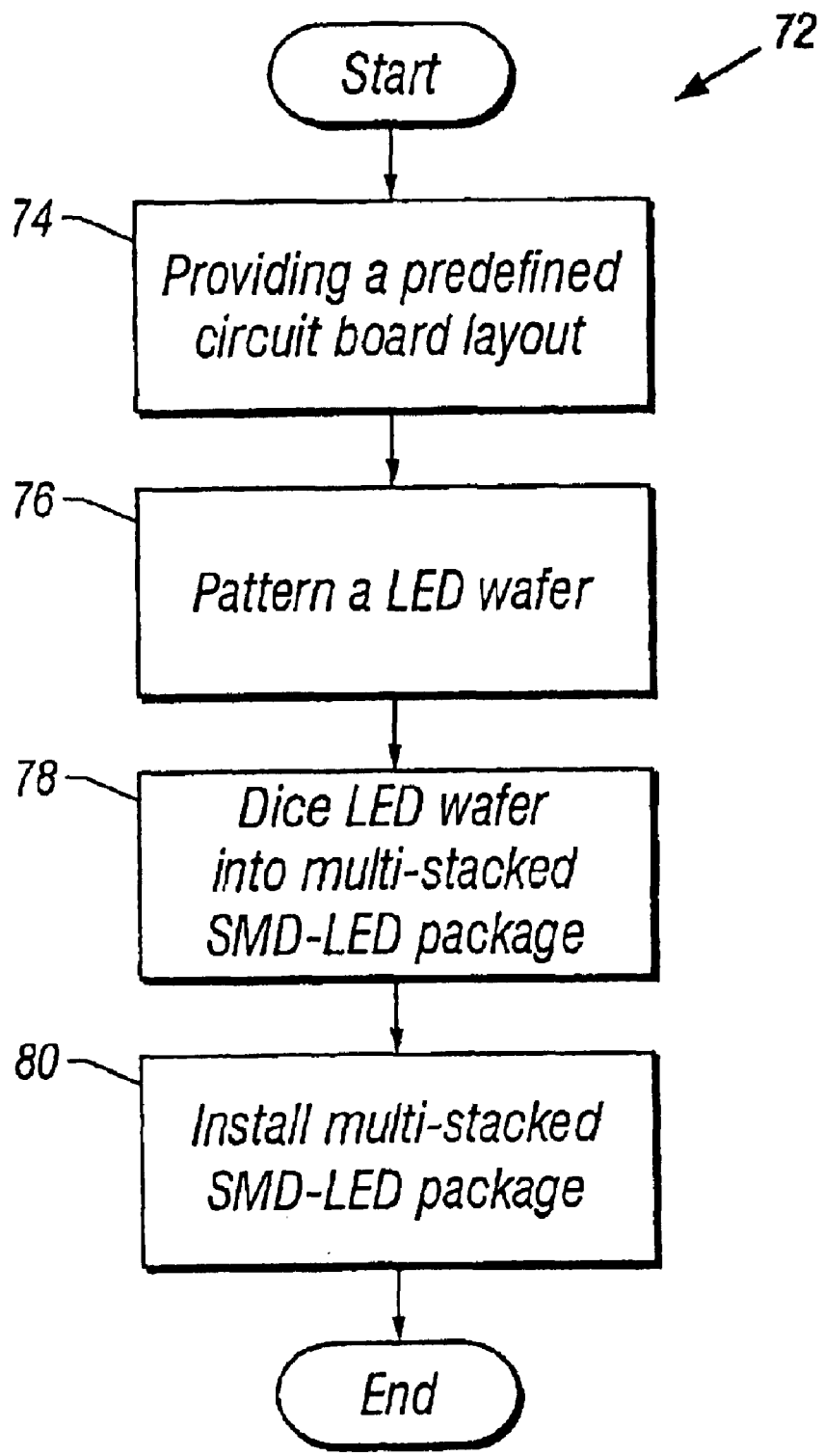
FIG. 7 is a flow chart of a method 72 for providing a multi-stacked SMD-LED package in accordance with one embodiment of the present invention.

FIG. 7 is a flow chart of a method 72 for providing a multi-stacked SMD-LED package in accordance with one embodiment of the present invention. Method 72 begins in a block 74 by providing a predefined circuit board layout for the type of multi-stacked SMD-LED package desired. For example, to fabricate a 2-high SMD-LED package, the circuit board layout would conform with the circuit board shown in FIG. 6 to provide the proper cathode and anode connections for the LED dies. As described above, the circuit board layout may easily be configured to fabricate other embodiments of the present invention.

The predefined circuit board layout is then used to pattern a LED wafer in a block 76, such as the round LED wafer illustrated in FIG. 4. After patterning, the LED wafer will contain the proper connections for the selected multi-stacked SMD-LED package. The LED wafer is then diced in a block 78, depending on the type of multi-stacked SMD-LED package selected. If for example, a 2×2 array SMD-LED package is required, the LED wafer will be diced by every two SMD-LED packages in both the vertical and horizontal directions. Finally, the multi-stacked SMD-LED package is wave soldered to a PCB in a block 80 and ready to operate and emit status signals.

Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

What is claimed is:

1. A surface mount light emitting diode package, comprising:

an integrated circuit substrate;

a plurality of light emitting diode die formed on the integrated circuit substrate; and a plurality of electrical contacts on the outside of the integrated circuit substrate, said contacts adapted for surface mounting to a circuit board and providing electrical signals to said plurality of light emitting diode die wherein the plurality of light emitting diode die comprise a stack of at least two die arranged in a line with a reinforcing pin integrally formed on the outside of the integrated circuit substrate, and wherein one of said plurality of electrical contacts comprises a cathode contact and wherein another of said plurality of electrical contacts comprises an anode contact, and wherein the reinforcing pin comprises a nonelectrode reinforcing pin positioned between the cathode contact and the anode contact.

2. The surface mount light emitting diode package as recited in claim 1, wherein the line of die is adapted to foam a right angle with respect to the circuit board when the package is mounted to the circuit board.

3. The surface mount light emitting diode package as recited in claim 1, wherein the plurality of light emitting diode die comprise an array of die having at least two rows and two columns.

4. A surface mount light emitting diode package, comprising:

a housing;

a plurality of light emitting diode die supported by the housing; and a plurality of electrical contacts on the outside of the housing, said contacts adapted for surface mounting to a circuit board and providing electrical signals to said plurality of light emitting diode die, wherein the plurality of die comprise integrally connected adjacent die cut from a same integrated circuit wafer, and wherein the plurality of light emitting diode die comprise a stack of at least two die arranged in a line with the line adapted to form a right angle with respect to the circuit board when the package is mounted to the circuit board.

5. The surface mount light emitting diode package as recited in claim 4, wherein the plurality of light emitting diode die comprise an array of die having at least two rows and two columns.

6. The surface mount light emitting diode package as recited in claim 4, further comprising a reinforcing pin formed on the integrally connected adjacent die.

* * * * *

UNITED STATES PATENT AND TRADEMARK OFFICE
CERTIFICATE OF CORRECTION

PATENT NO. : 6,833,563 B2
DATED : December 21, 2004
INVENTOR(S) : Rinaldi et al.

It is certified that error appears in the above-identified patent and that said Letters Patent is hereby corrected as shown below:

Column 6,
Line 4, delete "foam" and insert -- form --.

Signed and Sealed this

Twelfth Day of July, 2005

JON W. DUDAS
*Director of the United States Patent and Trademark Office*